(12) United States Patent
Tsao et al.

(10) Patent No.: US 10,298,258 B1
(45) Date of Patent: May 21, 2019

(54) DATA COMPRESSION METHOD BASED ON SAMPLING AND ESTIMATION

(71) Applicant: AccelStor Ltd., Taipei (TW)

(72) Inventors: Shih-Chiang Tsao, Taipei (TW);
Ting-Fang Chien, Taipei (TW);
Yu-Chia Cheng, Taipei (TW)

(73) Assignee: ACCELSTOR LTD., Taipei (TW)

( * ) Notice: Subject to any disclaimer, the term of this patent is extended or adjusted under 35 U.S.C. 154(b) by 0 days.

(21) Appl. No.: 16/136,771

(22) Filed: Sep. 20, 2018

(30) Foreign Application Priority Data

Aug. 30, 2018 (CN) .......................... 2018 1 1000116

(51) Int. Cl.
*H03M 7/30* (2006.01)

(52) U.S. Cl.
CPC ....... *H03M 7/3062* (2013.01); *H03M 7/3095* (2013.01)

(58) Field of Classification Search
CPC .......................... H03M 7/3062; H03M 7/3095
USPC ............................................................ 341/51
See application file for complete search history.

(56) References Cited

U.S. PATENT DOCUMENTS

| | | | |
|---|---|---|---|
| 6,535,845 B2* | 3/2003 | Van Der Vleuten | G11B 20/00007 341/77 |
| 8,963,748 B2* | 2/2015 | Deslandes | G06T 9/00 341/76 |
| 8,988,257 B2* | 3/2015 | Dickie | H03M 7/4037 341/106 |
| 9,041,567 B2* | 5/2015 | Jaquette | H03M 7/30 341/50 |

* cited by examiner

*Primary Examiner* — Brian K Young
(74) *Attorney, Agent, or Firm* — Birch, Stewart, Kolasch & Birch, LLP

(57) ABSTRACT

A data compression method based on sampling and estimation is provided. The method includes: receiving a piece of data; extracting N data regions from M data regions of the piece of data; examining a data redundancy ratio in the N data regions; and determining, according to a value of the data redundancy ratio, whether to compress the piece of data.

10 Claims, 3 Drawing Sheets

DATA COMPRESSION METHOD BASED ON SAMPLING AND ESTIMATION

CROSS-REFERENCE TO RELATED APPLICATION

This non-provisional application claims priority under 35 U.S.C. § 119(a) to Patent Application No. 201811000116.X filed in China, P.R.C. on Aug. 30, 2018, the entire contents of which are hereby incorporated by reference.

BACKGROUND

Technical Field

The present invention relates to a compression method, and in particular, to a data compression method based on sampling and estimation.

Related Art

Real-time data compression needs to be performed quickly, and usually adopts an algorithm having a relatively poor compression capability but a relatively high compression speed. However, to achieve a high speed, whether there is sufficient data redundancy usually fails to be determined. Consequently, the size of data obtained after compression is even larger than that before compression. Such compression is meaningless.

SUMMARY

In view of this, an embodiment of the present invention provides a data compression method based on sampling and estimation, including: receiving a piece of data, where the piece of data includes M data regions; extracting N data regions from the M data regions of the piece of data, where N<M, and N and M are both positive integers; examining a data redundancy ratio in the N data regions; and determining, according to a value of the data redundancy ratio, whether to compress the piece of data.

Another embodiment of the present invention further provides a data compression method based on sampling and estimation, in which the following steps are performed in sequence on each of a plurality of pieces of data: extracting $N_i$ data regions from the $M_i$ data regions of the $i^{th}$ piece of data, where N<M, and N, M, and i are all positive integers; examining data redundancies in the $N_i$ data regions; when a ratio of the number of completely data-redundant areas to the number of the extracted data regions is equal to or more than a threshold, storing the $i^{th}$ piece of data in a buffer; and when a compression condition is satisfied, compressing an $x^{th}$ piece of data to the $i^{th}$ piece of data in the buffer, where the compression condition is $$\sum_{x}^{i} \frac{N_i}{M_i} \le K \text{ and } \sum_{x}^{i+1} \frac{N_i}{M_i} > K,$$

and x and K are positive integers.

In conclusion, according to the data compression method based on sampling and estimation provided in the embodiments of the present invention, to-be-stored data may be sampled, and a data redundancy ratio is examined to estimate whether the data is worth being compressed, so that the compression speed and the compression rate can both be considered.

BRIEF DESCRIPTION OF THE DRAWINGS

The present invention will become more fully understood from the detailed description given herein below for illustration only, and thus are not limitative of the present invention, and wherein.

DETAILED DESCRIPTION

Figure 1:
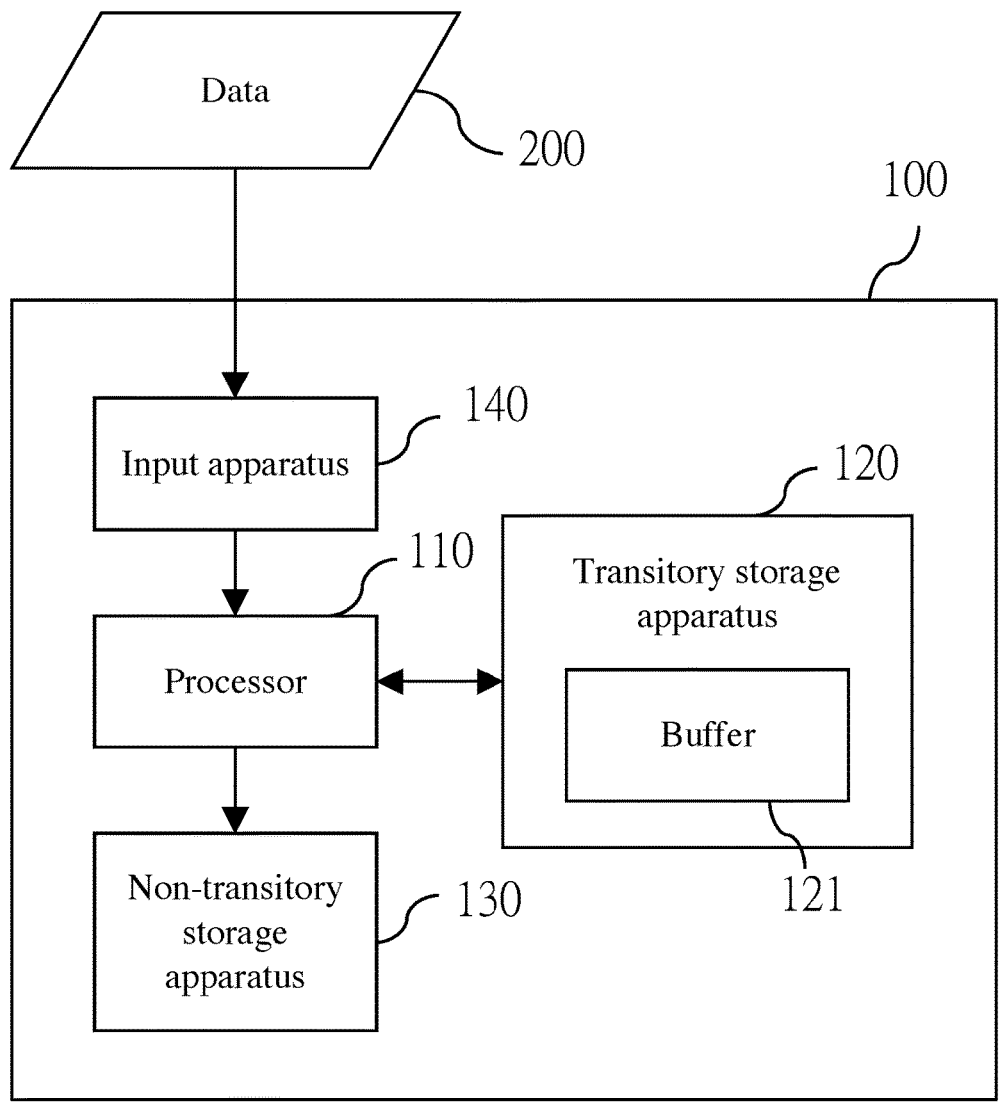
FIG. 1 is an architectural diagram of a system according to an embodiment of the present invention.

Referring to FIG. 1, FIG. 1 is an architectural diagram of a system according to an embodiment of the present invention. This embodiment of the present invention is implemented by a computer system 100. The computer system 100 includes a processor 110, a transitory storage apparatus 120 (such as a volatile memory), a non-transitory storage apparatus 130 (such as a hard disk or a solid-state hard disk) and an input apparatus 140 (such as a network interface or an external storage apparatus (for example, a USB flash drive or an external hard disk)). The computer system 100 may be, for example, a personal computer, a server, or a server cluster. The transitory storage apparatus 120 includes a buffer 121. In some embodiments, the buffer 121 is located on a volatile memory in the non-transitory storage apparatus 130. In some embodiments, the buffer 121 is located on a non-volatile storage medium in the non-transitory storage apparatus 130.

Figure 2:
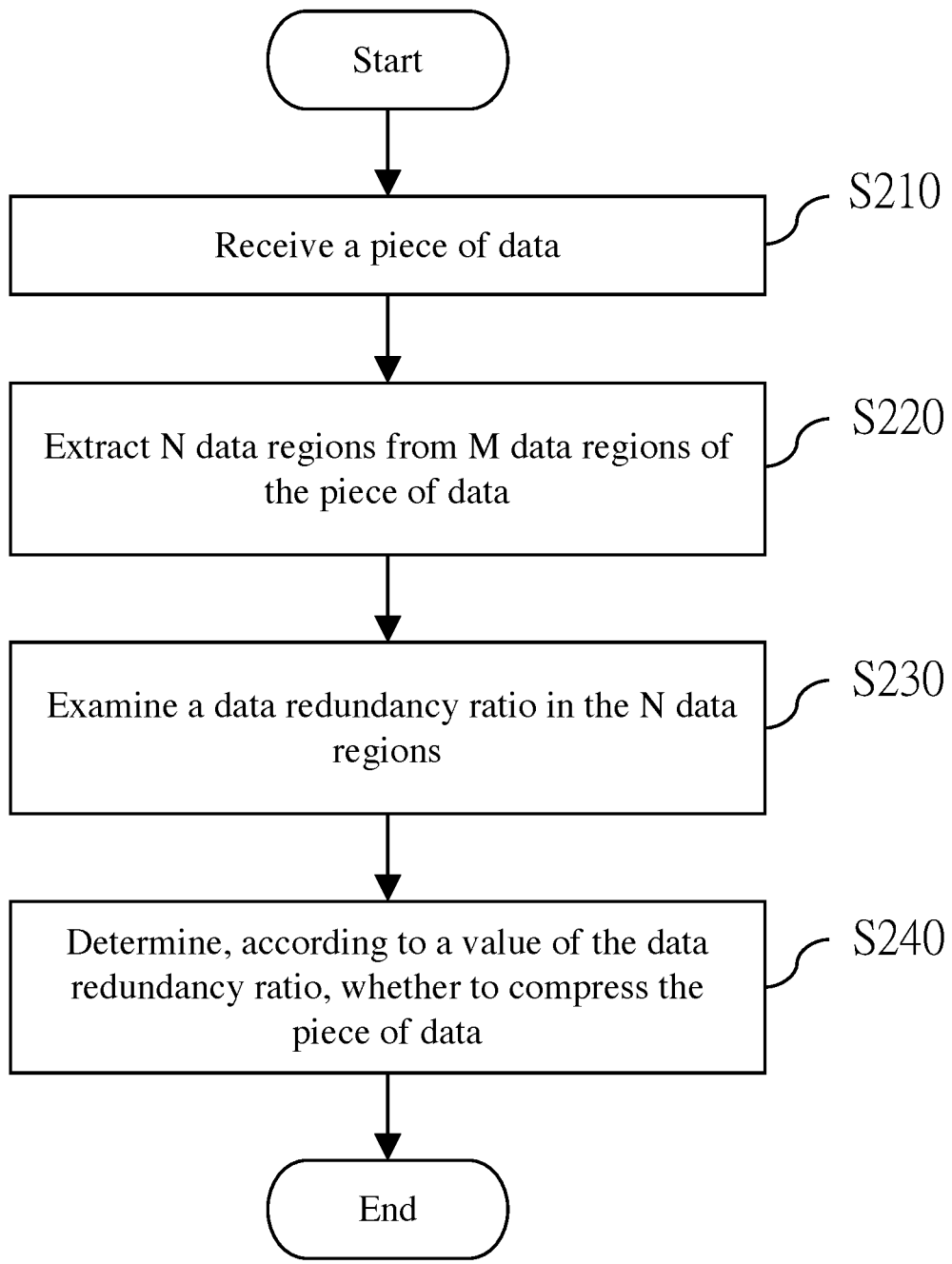
FIG. 2 is a flowchart of a data compression method based on sampling and estimation according to an embodiment of the present invention.

Referring to FIG. 2, FIG. 2 is a flowchart of a data compression method based on sampling and estimation according to an embodiment of the present invention; and the flow is executed by a processor 110 after a program is loaded by the processor 110. The program may be stored in a non-transitory storage apparatus 130. First, a piece of data 200 is received from an input apparatus 140. The data 200 includes M data regions (step S210). Herein, M is a positive integer. Referring to Table 1, Table 1 is an example of the M data regions (R1 to R16). Herein, M is 16. In step S220, N data regions are extracted from the M data regions of this piece of data 200. Herein, N is 4. However, this embodiment of the present invention is not limited thereto, provided that N is a positive integer less than M. In step S230, a data redundancy ratio in these N data regions is examined. As shown in Table 1, the symbol "Z" is used to represent that a corresponding data region is completely data-redundant. The data redundancy may be, for example, zero or another character that can be considered as redundant. In this embodiment, all the four extracted data regions are data-redundant. Therefore, the data redundancy ratio is 100%. In step S240, whether to compress the piece of data 200 is determined according to a value of the data redundancy ratio. Herein, whether to compress the piece of data 200 may be determined according to whether a ratio of the number of completely data-redundant areas to the number of the extracted data regions is equal to or more than a threshold. In this embodiment, the threshold may be set to 100%. Because the data redundancy ratio of the extracted four data regions is 100%, the piece of data 200 is compressed. It is not limited that the compression can only be performed on a single piece of data 200, and compression can also be performed on a plurality of pieces of data 200 after the plurality of pieces of data 200 are accumulated. Detailed descriptions are provided hereinafter.

TABLE 1

| R1 | R2 | R3 | R4 | R5 | R6 | R7 | R8 | R9 | R10 | R11 | R12 | R13 | R14 | R15 | R16 |
|----|----|----|----|----|----|----|----|----|-----|-----|-----|-----|-----|-----|-----|
|    | Z  |    |    | Z  |    |    |    |    | Z   |     |     |     | Z   |     |     |

Herein, a case in which the data redundancy ratio is not 100% is exemplified by using Table 2. Herein, the symbol "A" is used to represent that a corresponding data region is not completely data-redundant, that is, at least a part of the data region is not data-redundant. In this embodiment, three data regions in the extracted four data regions are data-redundant, and the remaining data region is not completely data-redundant. Therefore, the data redundancy ratio is 75%. If the threshold is set to 100%, this piece of data 200 is not compressed.

TABLE 2

| R1 | R2 | R3 | R4 | R5 | R6 | R7 | R8 | R9 | R10 | R11 | R12 | R13 | R14 | R15 | R16 |
|----|----|----|----|----|----|----|----|----|-----|-----|-----|-----|-----|-----|-----|
|    | Z  |    |    | Z  |    |    |    |    | A   |     |     |     | Z   |     |     |

Figure 3:
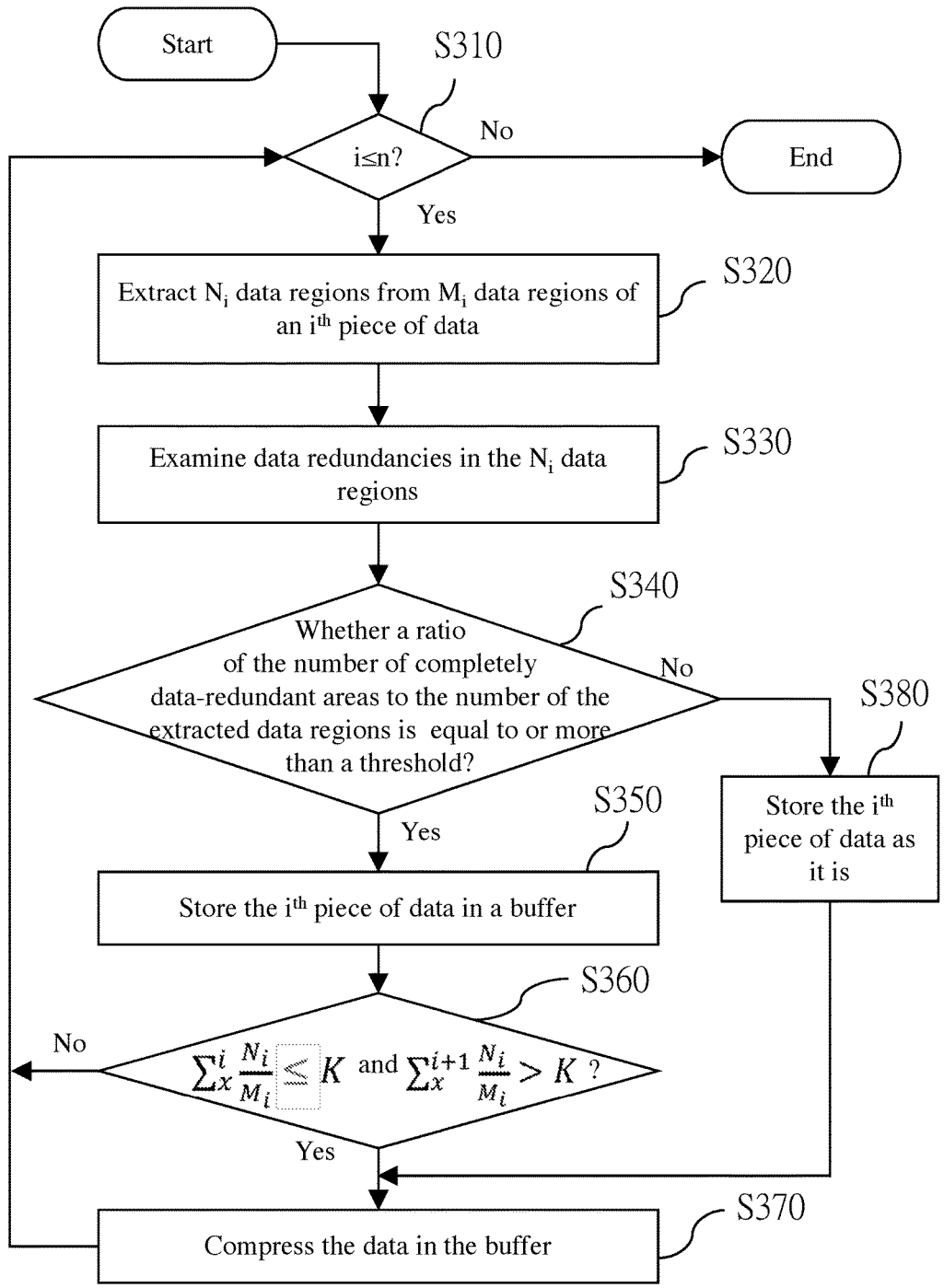
FIG. 3 is a flowchart of a data compression method based on sampling and estimation according to another embodiment of the present invention.

Referring to FIG. 3, FIG. 3 is a flowchart of a data compression method based on sampling and estimation according to another embodiment of the present invention; and the flow is executed by a processor 110 after a program is loaded by the processor 110. Herein, it is assumed that n pieces of data 200 are processed in sequence, where n is a positive integer. Herein, for example, n is 8. As shown in Table 3, there are a total of eight pieces of data 200. In step S310, whether i is less than or equal to n is determined. Namely, whether processing on the n pieces of data 200 is completed is determined. Herein, i represents a sequence of the data 200 that is being processed, and i is a positive integer. If the processing on the n pieces of data 200 is completed, the flow ends; otherwise, the method proceeds to step S320. In this embodiment, an $i^{th}$ piece of data 200 includes $M_i$ data regions. $M_i$ is a positive integer. Herein, $M_i$ is 16, but this embodiment of the present invention is not limited thereto. Next, the method proceeds to step S330.

In the step S330, data redundancies in these extracted $N_i$ data regions are examined. By using a first piece of data D1 as an example, as shown in Table 3, extracted data regions R2, R5, R10, and R14 are all data-redundant.

Next, in step S340, whether a ratio of the number of completely data-redundant areas to the number of the extracted data regions is equal to or more than a threshold is determined. If yes, the method proceeds to step S350, to store the $i^{th}$ piece of data 200 in a buffer 121 to facilitate subsequent compression. If not, it indicates that there is a strong possibility that the $i^{th}$ piece of data 200 is not suitable for compression, and the method proceeds to step S380, to store the $i^{th}$ piece of data 200 as it is. Herein, descriptions are provided still by using that the threshold is 100% as an example. Because the four data regions extracted from the first piece of data D1 are all data-redundant, the first piece of data D1 is stored in the buffer 121, and then the method proceeds to step S360.

In the step S360, a sum of $N_i/M_i$ corresponding to an $x^{th}$ piece to the $i^{th}$ piece of the data 200 in the buffer 121 is calculated. Herein, there is only the first piece of data D1 in the buffer 121, and the sum of $N_i/M_i$ thereof is ¼. In this step, whether the sum of $N_i/M_i$ is less than or close to K is determined, and that the sum of $N_i/M_i$ is less than or close to K is used as a compression condition. K is a positive integer, and herein, for example, K is 1. That the sum of $N_i/M_i$ is close to K means that the sum of $N_i/M_i$ is less than or equal to a maximum value of K. If $N_i/M_i$ (that is, $N_{i+1}/M_{i+1}$) of a next piece of data 200 is added to the sum, the sum is greater than K. Herein, because $N_{i+1}/M_{i+1}$ is also

TABLE 3

|    | R1 | R2 | R3 | R4 | R5 | R6 | R7 | R8 | R9 | R10 | R11 | R12 | R13 | R14 | R15 | R16 |
|----|----|----|----|----|----|----|----|----|----|-----|-----|-----|-----|-----|-----|-----|
| D1 |    | Z  |    |    | Z  |    |    |    |    | Z   |     |     |     | Z   |     |     |
| D2 |    |    | Z  |    | Z  |    | Z  |    |    |     |     |     |     |     |     | Z   |
| D3 |    |    |    |    |    |    |    |    |    |     | Z   | Z   | Z   | Z   |     |     |
| D4 |    | Z  |    | Z  |    | Z  |    |    |    |     |     | Z   |     |     |     |     |
| D5 |    | Z  | A  |    |    | A  |    |    |    |     |     | Z   |     |     |     |     |
| D6 |    |    |    | Z  | Z  |    | Z  |    |    |     |     |     |     |     |     | Z   |
| D7 |    |    |    |    |    |    |    |    | Z  | Z   |     |     | Z   | Z   |     |     |
| D8 |    | A  | A  |    | Z  |    |    |    |    |     |     |     |     | A   | A   |     |

In the step S320, $N_i$ data regions are extracted from the $M_i$ data regions of the $i^{th}$ piece of data 200. $N_i$ is less than $M_i$. In this embodiment, $N_i$ is a same value. Herein, $N_i$ is 4, but ¼, the sum thereof is ½. This does not satisfy the compression condition, and the method returns to the step S310, to examine a second piece of data D2.

The foregoing steps are repeated. It is found that data redundancy ratios of the first to fourth pieces of data D1 to D4 all exceed a threshold, and the data D1 to D4 are all stored in the buffer 121. In addition, $N_i/M_i$ of each of the first to fourth pieces of data D1 to D4 is ¼, and a sum thereof is K. This satisfies the compression condition. Therefore, the method proceeds to step S370, to compress the first to fourth pieces of data D1 to D4 in the buffer 121. Next, the method returns to the step S310, to examine and process a fifth piece of data D5.

Referring to Table 3, data regions R4 and R8 in the four data regions R2, R4, R8, and R13 extracted from the fifth piece of data D5 are not completely data-redundant. Therefore, in the step S340, it is determined that the data redundancy ratio is merely 50%, which is less than the threshold, and it indicates that there is a relatively strong possibility for the fifth piece of data D5 to have a relatively low compression efficiency, and therefore the method proceeds to the step S380. In the step S380, the fifth piece of data D5 is stored as it is and is not compressed.

After the step S380, the method proceeds to the step S370, to compress the data 200 in the buffer 121. In other words, the compression condition further includes that the data redundancy ratio of the $i^{th}$ piece of data is less than the threshold. If the data redundancy ratio of the $i^{th}$ piece of data is less than the threshold, the $i^{th}$ piece of data 200 is not compressed, and the data 200 in the buffer 121 is compressed. After the step S370 is performed, the method returns to the step S310, to continue to examine subsequent data 200, and the flow ends until processing on all the data 200 is completed.

herein. That is, $N_i/M_i$ of each piece of the data 200 is not completely the same. $N_i/M_i$ of the first piece of data D1 is ¼, $N_i/M_i$ of the second piece of data D2 is ½, and $N_i/M_i$ of a third piece of data D3 is ⅛. Data redundancy ratios of these three pieces of data D1 to D3 are all 100%, and the sum of $N_i/M_i$ is close to K (where K is still set to 1 herein). Therefore, in the step S370, the three pieces of data D1 to D3 are compressed into a size not greater than that of a piece of data 200.

Next, for a fourth piece of data D4, data regions R3, R4, R7, R9, R11, and R14 are not completely data-redundant, and therefore the method proceeds to the step S380, to store the fourth piece of data D4 as it is. Then, because there is no data 200 in the buffer 121 at this moment, the method returns to the step S310, to continue to process the subsequent data 200.

$N_i/M_i$ of the fifth piece of data D5 is ⅜. $N_i/M_i$ of a sixth piece of data D6 is ⅛. $N_i/M_i$ of a seventh piece of data D7 is ¼. $N_i/M_i$ of an eighth piece of data D8 is ⅛. Data redundancy ratios of these four pieces of data D5 to D8 are all 100%, and the sum of $N_i/M_i$ is close to K (where K is still set to 1 herein). Therefore, in the step S370, the four pieces of data D5 to D8 are compressed into a size not greater than that of a piece of data 200.

In some embodiments, a data redundancy ratio of a previous piece of data 200 or data redundancy ratios of a plurality of pieces of examined data 200 affect subsequent sampling. For example, if a data redundancy ratio of current piece of data 200 is relatively high, the number of data regions extracted from a next piece of data 200 can be

TABLE 4

|    | R1 | R2 | R3 | R4 | R5 | R6 | R7 | R8 | R9 | R10 | R11 | R12 | R13 | R14 | R15 | R16 |
|----|----|----|----|----|----|----|----|----|----|-----|-----|-----|-----|-----|-----|-----|
| D1 |    | Z  |    |    | Z  |    |    |    |    | Z   |     |     |     | Z   |     |     |
| D2 | Z  |    | Z  |    |    | Z  |    | Z  | Z  |     |     | Z   | Z   |     |     | Z   |
| D3 |    |    |    |    |    |    | Z  |    |    |     | Z   |     |     |     |     |     |
| D4 | Z  |    | A  | A  |    |    | A  |    | A  |     | A   |     |     | A   | Z   |     |
| D5 |    |    |    |    |    | Z  | Z  | Z  | Z  | Z   | Z   |     |     |     |     |     |
| D6 |    |    |    |    |    |    | Z  |    |    | Z   |     |     |     |     |     |     |
| D7 | Z  |    | Z  |    |    |    |    |    |    |     | Z   |     | Z   |     |     |     |
| D8 |    | Z  |    | Z  |    |    |    |    |    |     |     |     |     |     |     |     |

Referring to Table 4, varied cases of the number of data regions extracted from each piece of data 200 is shown reduced; otherwise, the number of data regions extracted from the next piece of data 200 is increased.

TABLE 5

|    | R1 | R2 | R3 | R4 | R5 | R6 | R7 | R8 | R9 | R10 | R11 | R12 | R13 | R14 | R15 | R16 |
|----|----|----|----|----|----|----|----|----|----|-----|-----|-----|-----|-----|-----|-----|
| D1 |    | Z  |    | Z  | Z  |    | Z  |    | Z  |     |     |     | A   | Z   | A   |     |
| D2 | Z  | Z  | Z  |    |    |    |    |    | Z  |     |     | Z   | A   |     |     |     |
| D3 |    |    |    | Z  | Z  | A  | Z  |    | Z  | A   |     |     | Z   |     |     | Z   |
| D4 |    |    |    |    |    |    |    |    | Z  |     |     |     |     | Z   |     |     |
| D5 |    |    |    |    |    |    |    |    |    | Z   | Z   | Z   |     |     | A   |     |
| D6 | Z  |    |    | A  | A  |    |    | A  |    | A   | Z   |     |     |     |     |     |
| D7 |    |    |    |    |    | Z  | Z  |    |    |     |     |     |     | Z   | Z   |     |
| D8 |    | Z  |    |    | Z  |    |    |    |    |     |     |     |     |     |     |     |

Referring to Table 5, cases of settings of other thresholds are exemplified herein. In some embodiments, the threshold may not be set to 100% and may be set to a range of 50% to 100%. Descriptions are provided herein by using that the threshold is 70% as an example. Data regions R2, R4, R5, R7, R10, and R14 of the first piece of data D1 are data-redundant, and data regions R13 and R15 are not completely data-redundant. Therefore, the data redundancy ratio is 75% and exceeds the threshold. Therefore, the first piece of data D1 is stored in the buffer 121. Herein, it is assumed that K is 2. That is, it is expected that the size of compressed data does not exceed twice the size of the data 200. $N_i/M_i$ of the first piece of data D1 is ½.

Data regions R1, R2, R3, R9, and R12 of the second piece of data D2 are data-redundant, and the data region R13 is not completely data-redundant. Therefore, the data redundancy ratio is 83% and exceeds the threshold. Therefore, the second piece of data D2 is stored in the buffer 121. $N_i/M_i$ of the second piece of data D2 is ⅜.

The data redundancy ratio of the third piece of data D3 is 75%, and $N_i/M_i$ thereof is ½. The data redundancy ratio of the fourth piece of data D4 is 100%, and $N_i/M_i$ thereof is ⅛. The data redundancy ratio of the fifth piece of data D5 is 75%, and $N_i/M_i$ thereof is ¼. The sum of $N_i/M_i$ of the first piece to the fifth piece of data D1 to D5 is close to K. Then, in the step S370, the first piece to the fifth piece of data D1 to D5 are compressed. The data redundancy ratio of the sixth piece of data D6 is 33% and is less than the threshold. Therefore, in the step S380, the sixth piece of data D6 is stored as it is. Then, the method returns to the step S310, to continue to process the subsequent data 200.

In some embodiments, the size of a piece of data 200 may be set to 4 k bits, and therefore a plurality of pieces of data 200 can be stored into K pages after compression.

In conclusion, according to the data compression method based on sampling and estimation provided in the embodiments of the present invention, to-be-stored data may be sampled, and a data redundancy ratio is examined to estimate whether the data is worth being compressed, so that the compression speed and the compression rate can both be considered.

What is claimed is:

1. A data compression method based on sampling and estimation, comprising:
    receiving a piece of data, wherein the piece of data comprises M data regions;
    extracting N data regions from the M data regions of the piece of data, wherein N<M, and N and M are both positive integers;
    examining a data redundancy ratio in the N data regions; and
    determining, according to a value of the data redundancy ratio, whether to compress the piece of data.

2. The data compression method based on sampling and estimation according to claim 1, wherein the determining, according to a value of the data redundancy ratio, whether to compress the piece of data is determining whether a ratio of the number of completely data-redundant areas to the number of the extracted data regions is equal to or more than a threshold.

3. The data compression method based on sampling and estimation according to claim 2, further comprising: determining the number of extracted data regions of a next piece of data based on the data redundancy ratio of the current piece of data.

4. A data compression method based on sampling and estimation, comprising:
    performing the following steps in sequence on each of a plurality of pieces of data, wherein an $i^{th}$ piece of data comprises $M_i$ data regions:
    extracting $N_1$ data regions from the $M_i$ data regions of the $i^{th}$ piece of data, wherein N<M, and N, M, and i are all positive integers;
    examining data redundancies in the $N_i$ data regions;
    when a ratio of the number of completely data-redundant areas to the number of the extracted data regions is equal to or more than a threshold, storing the $i^{th}$ piece of data in a buffer; and
    when a compression condition is satisfied, compressing an $x^{th}$ piece of data to the $i^{th}$ piece of data in the buffer, wherein the compression condition is $$\sum_{x}^{i} \frac{N_i}{M_i} \leq K \text{ and } \sum_{x}^{i+1} \frac{N_i}{M_i} > K,$$

and x and K are positive integers.

5. The data compression method based on sampling and estimation according to claim 4, wherein the compression condition further comprises that a data redundancy ratio of the $i^{th}$ piece of data is less than the threshold, and if the data redundancy ratio of the $i^{th}$ piece of data is less than the threshold, the $i^{th}$ piece of data is not compressed, and the data in the buffer is compressed.

6. The data compression method based on sampling and estimation according to claim 4, wherein K is 1.

7. The data compression method based on sampling and estimation according to claim 4, wherein $$\frac{N_i}{M_i}$$

of each piece of the data is the same.

8. The data compression method based on sampling and estimation according to claim 4, wherein $$\frac{N_i}{M_i}$$

of each piece of the data is not completely the same.

9. The data compression method based on sampling and estimation according to claim 4, further comprising: determining the number of extracted data regions of a next piece of data based on the data redundancy ratio of the current piece of data.

10. The data compression method based on sampling and estimation according to claim 4, wherein the threshold is in a range of 50% to 100%.

* * * * *